United States Patent
Ackermann et al.

(10) Patent No.: US 11,981,275 B2
(45) Date of Patent: May 14, 2024

(54) DEVICE FOR ENERGY DISTRIBUTION AND/OR ENERGY CONVERSION

(71) Applicant: EUGEN FORSCHNER GMBH, Spaichingen (DE)

(72) Inventors: Janosch Ackermann, Spaichingen (DE); Hubert Bischof, Spaichingen (DE); Manuel Bremm, Spaichingen (DE); Holger Driesch, Spaichingen (DE)

(73) Assignee: EUGEN FORSCHNER GMBH, Spaichingen (DE)

( * ) Notice: Subject to any disclaimer, the term of this patent is extended or adjusted under 35 U.S.C. 154(b) by 379 days.

(21) Appl. No.: 17/423,041

(22) PCT Filed: Jan. 7, 2020

(86) PCT No.: PCT/EP2020/050190
§ 371 (c)(1),
(2) Date: Jul. 14, 2021

(87) PCT Pub. No.: WO2020/148111
PCT Pub. Date: Jul. 23, 2020

(65) Prior Publication Data
US 2022/0063528 A1    Mar. 3, 2022

(30) Foreign Application Priority Data
Jan. 15, 2019    (DE) .................. 10 2019 100 877.8

(51) Int. Cl.
*B60R 16/033*    (2006.01)
*B60L 50/61*    (2019.01)
(Continued)

(52) U.S. Cl.
CPC ............ *B60R 16/033* (2013.01); *B60L 50/61* (2019.02); *B60L 58/20* (2019.02); *H05K 7/20854* (2013.01); *B60L 2210/10* (2013.01)

(58) Field of Classification Search
CPC ........ B60R 16/033; B60L 50/61; B60L 58/20; B60L 2210/10; H05K 7/20854
See application file for complete search history.

(56) References Cited

U.S. PATENT DOCUMENTS 9,834,097 B2 * 12/2017 Shin .................. B60L 50/51
2007/0087266 A1 * 4/2007 Bourke ............. H01M 50/505
429/61
(Continued)

FOREIGN PATENT DOCUMENTS

| DE | 10 2006 034 020 A1 | 4/2008 |
|----|--------------------|--------|
| DE | 10 2013 215 245 A1 | 2/2015 |

(Continued)

*Primary Examiner* — John D Walters
(74) *Attorney, Agent, or Firm* — BIRCH, STEWART, KOLASCH & BIRCH, LLP

(57) ABSTRACT

The invention relates to a device for energy storage, energy distribution and/or energy conversion in a hybrid or electric vehicle, comprising at least one high-voltage system having at least one high-voltage unit. In order to provide a simple, efficient and safe device, according to the invention, the high-voltage system has a hermetically encapsulated housing having at least one wall, in which housing at least one unit chamber for receiving the high-voltage unit and at least one interface chamber for receiving at least one interface region are arranged.

19 Claims, 1 Drawing Sheet

(51) Int. Cl.
*B60L 58/20* (2019.01)
*H05K 7/20* (2006.01)

(56) References Cited

U.S. PATENT DOCUMENTS

2013/0176761 A1* 7/2013 Hattori .................... B60L 50/16
363/131
2015/0328993 A1 11/2015 Shin

FOREIGN PATENT DOCUMENTS

| DE | 10 2014 225 033 A1 | 11/2015 |
|----|---|---|
| EP | 2 624 432 A1 | 8/2013 |
| WO | WO 2021/169764 A2 | 12/2012 |

* cited by examiner

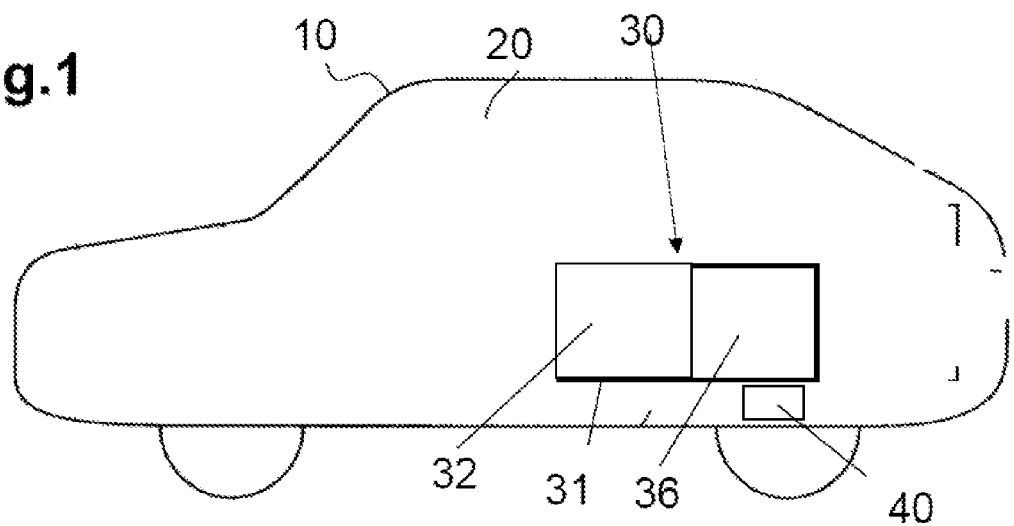
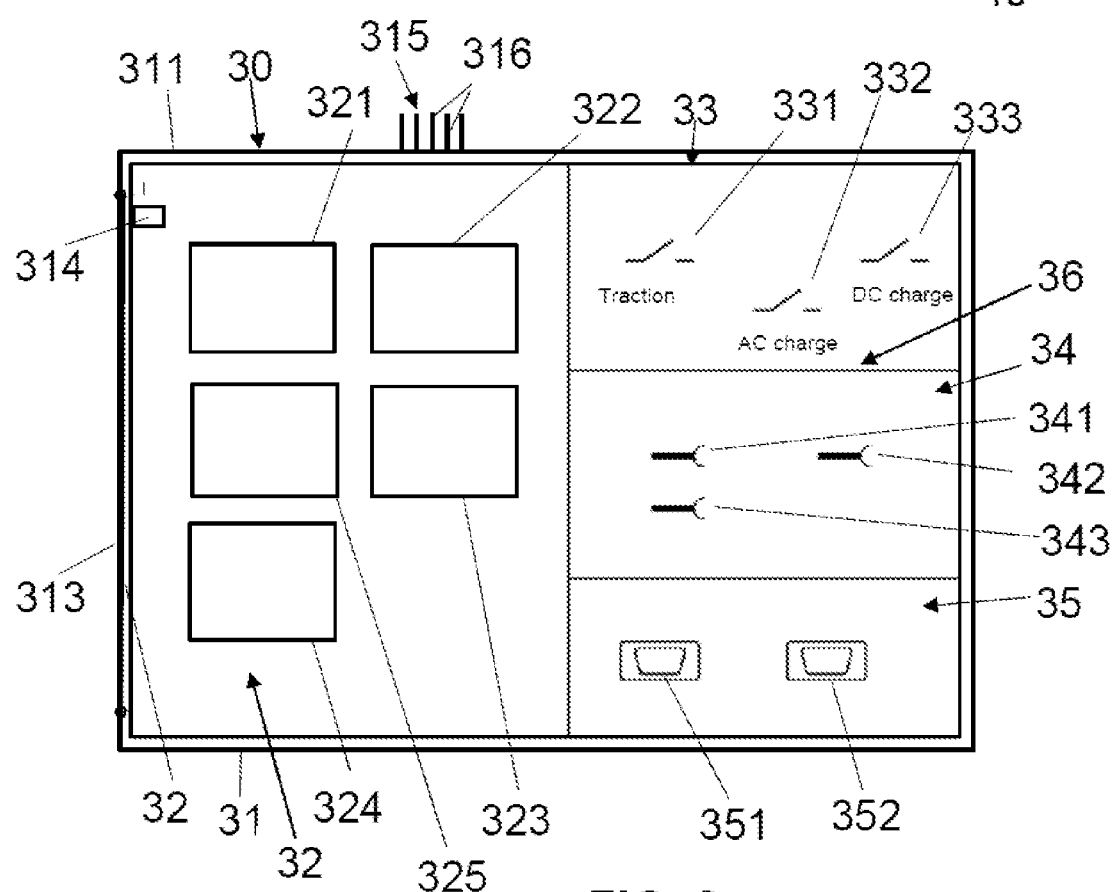

DEVICE FOR ENERGY DISTRIBUTION AND/OR ENERGY CONVERSION

The invention relates to a device for energy distribution and/or energy conversion, in particular in a hybrid or electric vehicle, in accordance with the precharacterizing clause of claim 1.

An air conditioning device for a vehicle interior of an electric vehicle is known, for example, from WO 2012/169 764 A2. In the case of this known device, heat recovery of various electrical components of the electric vehicle which are arranged along a heat carrier flow takes place.

The object of the invention is to provide a simple and efficient and safe device for energy distribution and/or energy conversion, in particular in a hybrid or electric vehicle.

This object is achieved by a device having the features of claim 1. Advantageous configurations of the invention are specified in the dependent claims related thereto.

The device according to the invention having at least one energy-distributing and/or protecting unit, which in the technical field is sometimes also referred to as power distribution unit (PDU) or power distribution module (PDM), and comprises at least one DC-DC converter and further high-voltage components, is characterized by the fact that it comprises a common housing, in which the at least one energy-distributing and/or protecting unit and the at least one DC-DC converter are arranged and the further high-voltage components are hermetically encapsulated. Further possible high-voltage components are the following components: a battery, a device for charging the battery (OBC=on-board charger), a heater or cooler, an inverter or a controller of an air-conditioning compressor. The hermetic encapsulation ensures that no impermissible interventions by third parties with respect to the high-voltage components can take place.

Preferably, the device according to the invention has, in the common, hermetically encapsulated housing, at least one assembly chamber for accommodating the abovementioned high-voltage components and at least one interface chamber, which is physically separated therefrom, for the electrical connection and the communication with adjacent assemblies.

Advantageously, the interface chamber has a high-voltage interface region, which is provided with one or more high-voltage interfaces. The term high-voltage interfaces is used to refer to those interfaces in which the transmitted voltage is greater than, for example, 60 V. The high-voltage interfaces are formed by an interface to a traction drive of the vehicle, an interface for charging the battery by means of direct current and/or an interface for charging the battery by means of alternating current.

Advantageously, the interface chamber has a low-voltage interface region, which is provided with one or more low-voltage interfaces. The term low-voltage interfaces is used to refer to those interfaces in which the transmitted voltage is less than or equal to a voltage of, for example, 60 V. The low-voltage interfaces are formed by an interface for a stabilized control voltage of, for example, 12 V+/−1 V, by a redundant interface for a stabilized control voltage of, for example, 12 V+/−1 V, as is required as independent backup, for example, for assemblies for the autonomous driving of the vehicle and/or by at least one further interface, which supplies power to other low-voltage consumers in voltage ranges of, for example, from 12 V to 60 V.

Advantageously, the interface chamber also has a communications interface region, which is provided with one or more communications interfaces. These interfaces are used for unidirectional or bidirectional signal transmission between the high-voltage components and other assemblies or control devices of the vehicle. They can be in the form of one or more of the communication standards which are conventional in vehicles, for example in the form of a CAN bus, in the form of a LIN bus or in the form of an ethernet, fast ethernet or gigabit ethernet interface.

Advantageously, the housing has at least one closable opening, which is provided with at least one apparatus for verifying a legitimate or impermissible opening operation. This apparatus can be formed, for example, by a lock, a combination lock, a radio-activated lock or security tagging, wherein, preferably, a sensor and recording electronics for logging the opening and closing operations and the authorizations used therefor are assigned to the lock. The closable opening can only be used by authorized maintenance personnel for the purpose of maintaining or replacing defective components.

Advantageously, at least one further electronic, electrical, electromechanical or electrochemical device generating heat losses or waste heat, in particular further high-voltage component parts, is arranged in the common housing. The arrangement in a common housing makes it possible to directly connect the various component parts to one another, with the result that a number of connecting cables and/or connectors between them which have until now been required can be dispensed with or at least reduced. The common housing also makes it possible to accommodate the various component parts in a very compact, space-saving, weight-saving and cost-saving manner. Furthermore, owing to the accommodation in a common housing which shields against electromagnetic radiation, fewer high-voltage components which need to be tested and shielded separately are provided, and common heat dissipation or cooling or use of the waste heat for heating other components or the vehicle interior is possible.

Preferably, the common housing at least partially has a heat-insulating wall. In regions of the housing in which component parts with increased heat development are arranged, the thermal insulation of the wall can be interrupted and even additional cooling ribs can be provided on the housing on the outer side of the wall.

A heat carrier flow, which is connected on the output side to the vehicle interior and/or a battery, preferably flows through the housing. Owing to the device according to the invention, central thermal energy management, which is combined in a single common housing, for an electric vehicle takes place, wherein the heat losses produced during the energy transmission and/or energy conversion of at least one electronic, electrical, electromechanical or electrochemical device is supplied to a heat carrier flow, which flows through the housing. The heat losses are in this case supplied as completely as possible to a heat carrier medium of the heat carrier flow and can therefore be used at a different point. The inlets and outlets for the heat carrier flow are in the form of secured openings in the wall of the hermetically encapsulated housing which only permit the inlet and outlet of heat carrier flows, but do not permit access to the high-voltage components arranged in the interior of the housing.

Where the term "electronic component parts" is used in this application, this also always includes electrical, electromechanical or electrochemical devices as well.

The device for charging the battery (OBC=on-board charger), which is preferably arranged in the common housing, and further electronic component parts, which are provided with power electronics, generally convert a significant proportion of the energy supplied to them into heat losses or waste heat. With the present invention, it is possible, for all component parts which have notable energy losses owing to heat development, for these proportions of losses to be supplied collectively for heating of the vehicle interior and/or for prewarming of the battery.

The heat carrier flow preferably uses air as the heat carrier, but, as an alternative to this, also cooling water or another cooling fluid or a combination thereof. The heat carrier flow can in this case be guided in such a way that the waste heat from the electronic component parts is taken up serially or, as an alternative to this, also at least partially parallel. It is particularly advantageous if the components having a lower waste-heat temperature are arranged upstream of the components having a higher waste-heat temperature, with the result that, preferably, a cascade with a continuously rising temperature in the heat carrier flow is formed.

In accordance with an advantageous development, the heat carrier flow can be influenced by means of at least one conveying apparatus, such as a blower or a pump, which, for their part, are likewise preferably arranged at least with their drive motor in the common housing. In connection with the power activation and the targeted efficiency change of the individual electronic component parts, a change in the conveying power of the conveying apparatus enables a heat input into the vehicle interior or to the vehicle battery which can be metered particularly finely.

Advantageously, the heat carrier flow emerging from the device can be split by means of a controllable switch for warming the vehicle interior and/or the battery. In this case, priorities for battery warming (or cooling) or for warming or cooling the vehicle interior can be set in the control device, preferably depending on the external temperature and state of charge of the battery.

Where mention is made above in connection with the device according to the invention of warming or heating of the vehicle interior or the battery, this likewise optionally also includes cooling.

The invention also relates to an advantageous use of a device according to the invention in a hybrid or electric vehicle.

Exemplary embodiments of the device according to the invention will be explained in more detail below with reference to the drawings, in which:

FIG. 1 shows a schematic view of a hybrid or electric vehicle having a vehicle interior, a drive and a device according to the invention, and FIG. 2 shows a schematic detail illustration of the apparatus according to the invention having a common housing, which has a high-voltage assembly chamber and an interface chamber having a high-voltage interface region, a low-voltage interface region and a communications interface region.

FIG. 1 shows a schematic illustration of a hybrid or electric vehicle 10, which has a vehicle interior 20 and is movable by means of at least one drive motor 40 fed by at least one battery 324.

A device, illustrated in detail in FIG. 2, for energy distribution and/or energy conversion 30 having at least one energy-distributing and/or protecting unit, which in the technical field is sometimes also referred to as power distribution unit (PDU) or power distribution module (PDM), is surrounded, along with all of the assemblies contained in it, which are described in detail below, by a common, hermetically encapsulated housing 31.

The housing 30 has at least one wall 311 forming the outer envelope. At least one opening 312 is provided in the wall, said opening being closable fixedly and in sealtight fashion by means of a door or flap 311. By means of an apparatus 314 for monitoring the opening of the flap 311, it is ensured that the flap 311 can firstly only be opened by authorized technical personnel who have the required operator code and/or key and secondly, each opening and closing operation is retained both in terms of time and in terms of the person performing the operation, unchangeably and indelibly.

The apparatus 314 can be formed, for example, by a lock, a combination lock, a radio-activated lock or security tagging, wherein, preferably, a sensor and recording electronics for logging the opening and closing operations and the authorizations used therefor are assigned to the lock. The closable opening 312 can therefore only be used by authorized maintenance personnel for the purpose of maintaining or replacing defective components.

Preferably, the device 30 according to the invention has, in the common, hermetically encapsulated housing 31, at least one assembly chamber 32 for accommodating high-voltage components and at least one interface chamber 36, which is physically separated therefrom, for the electrical connection and the communication with adjacent assemblies.

At least one a DC-DC converter 321 and further high-voltage components are accommodated in the assembly chamber 32. Further possible high-voltage components are the following components: a battery 324, a device for charging the battery 322 (OBC=on-board charger), a heater or cooler 323 and optionally a further high-voltage component 325, such as an inverter or a controller of an air-conditioning compressor. The hermetic encapsulation of the housing 31 ensures that no impermissible interventions by third parties with respect to the high-voltage components 321, 322, 323, 324 or 325 can take place.

Advantageously, the interface chamber 36 has a high-voltage interface region 33, which is provided with one or more high-voltage interfaces 331, 332, 333. The term high-voltage interfaces is used to refer to those interfaces in which the transmitted voltage is greater than, for example, 60 V. The high-voltage interfaces are formed by an interface 331 to a traction drive of the vehicle (for example, the electric drive motor 40), an interface 333 for charging the battery 324 by means of direct current and/or an interface 332 for charging the battery 324 by means of alternating current.

Advantageously, the interface chamber 36 has a low-voltage interface region 34, which is provided with one or more low-voltage interfaces 341, 342, 343. The term low-voltage interfaces is used to refer to those interfaces in which the transmitted voltage is less than or equal to a voltage of, for example, 60 V. The low-voltage interfaces are formed by an interface 341 for a stabilized control voltage of, for example, 12 V+/−1 V, by a redundant interface 342 for a stabilized control voltage of, for example, 12 V+/−1 V, as is required as independent backup, for example, for assemblies for the autonomous driving of a vehicle 10 and/or by at least one further interface 343, which supplies power to other low-voltage consumers in voltage ranges of, for example, from 12 V to 60 V.

Advantageously, the interface chamber 36 also has a communications interface region 35, which is provided with one or more communications interfaces 351, 352. These interfaces are used for unidirectional or bidirectional signal transmission between the high-voltage components 321, 322, 323, 324, 325 and other assemblies or control devices of the vehicle 10. They can be in the form of one or more of the communications standards which are conventional in vehicles, for example in the form of a CAN bus, in the form of a LIN bus or in the form of an ethernet, fast ethernet or gigabit ethernet interface.

Advantageously, at least one electronic, electrical, electromechanical or electrochemical device generating heat losses or waste heat, such as the PTC heater or PTC cooler 323 and further high-voltage component parts 325, is arranged in the common housing 31.

The arrangement in the common housing 31 makes it possible to directly connect the various high-voltage components 321, 322, 323, 324 or 325 and interfaces 331, 332, 333, 341, 342, 343, 351, 352 to one another and to the outside world, with the result that a number of connecting cables and/or connectors between them which until now have been required can be dispensed with or at least reduced. The common housing 31 also makes it possible to accommodate the various component parts in a very compact, space-saving, weight-saving and cost-saving manner.

Furthermore, owing to the accommodation in the common housing 31 which shields against electromagnetic radiation, fewer high-voltage components which need to be tested and shielded separately are provided, and common heat dissipation or cooling or use of the waste heat for heating other components or the vehicle interior 20 is possible.

Preferably, the common housing 31 at least partially has a heat-insulating wall. In regions 315 of the housing 31 in which component parts with increased heat development are arranged, the thermal insulation of the wall 31 can be interrupted and even additional cooling ribs 316 can be provided on the housing 31 on the outer side of the wall 31.

A heat carrier flow, which is connected on the output side to the vehicle interior 20 and/or a battery, preferably flows through the housing 31. Owing to the device 30 according to the invention, central thermal energy management, which is combined in a single common housing 31, for an electric vehicle 10 takes place, wherein the heat losses produced during the energy transmission and/or energy conversion of at least one electronic, electrical, electromechanical or electrochemical device is supplied to a heat carrier flow, which flows through the housing 31. The heat losses are in this case supplied as completely as possible to a heat carrier medium of the heat carrier flow and can therefore be used at a different point. The inlets and outlets for the heat carrier flow are in the form of secured openings in the wall 311 of the hermetically encapsulated housing 31 which only permit the inlet and outlet of heat carrier flows, but do not permit access to the high-voltage components 321, 322, 323, 324 or 325 arranged in the interior of the housing 31.

Where the term "electronic component parts" is used in this application, this also always includes electrical, electromechanical or electrochemical devices as well.

The device for charging the battery 322 (OBC=on-board charger), which is preferably arranged in the common housing 31, and further electronic component parts 321, which are provided with power electronics, generally convert a significant proportion of the energy supplied to them into heat losses or waste heat. With the present invention, it is possible, for all component parts which have notable energy losses owing to heat development, for these proportions of losses to be supplied collectively for heating of the vehicle interior 20 and/or prewarming of the battery 324.

The heat carrier flow preferably uses air as the heat carrier, but, as an alternative to this, also cooling water or another cooling fluid or a combination thereof. The heat carrier flow can in this case be guided in such a way that the waste heat from the electronic component parts is taken up serially or, as an alternative to this, also at least partially parallel. It is in particular advantageous if the components having a lower waste-heat temperature are arranged upstream of the components having a higher waste-heat temperature, with the result that, preferably, a cascade with a continuously rising temperature in the heat carrier flow is formed.

In accordance with an advantageous development, the heat carrier flow can be influenced by means of at least one conveying apparatus, such as a blower or a pump, which, for their part, are likewise preferably arranged at least with their drive motor in the common housing. In connection with the power activation and the targeted efficiency change of the individual electronic component parts, a change in the conveying power of the conveying apparatus enables a heat input into the vehicle interior or to the vehicle battery which can be metered particularly finely.

LIST OF REFERENCE SYMBOLS 10 hybrid or electric vehicle
20 vehicle interior
30 device for energy distribution and/or energy conversion
31 housing (of 30)
311 wall (of 31)
312 opening (in 311)
313 flap
314 apparatus for monitoring the opening (of 313)
315 (heat-dissipating) regions (of 311)
316 cooling ribs
32 assembly chamber (of 30)
321 DC-DC converter
322 device for charging 324 [on-board charger (OBC)]
323 PTC heater/cooler
324 battery
325 (further) high-voltage component
33 (first=high-voltage) interface region (of 30)
331 traction drive interface (Traction)
332 AC-charging interface (AC charge)
333 DC-charging interface (DC charge)
34 (second=low-voltage) interface region (of 30)
341 (first) low-voltage interface
342 (second) low-voltage interface
343 (third) low-voltage interface
35 (third=communications) interface region (of 30)
351 (first) communications interface
352 (second) communications interface
36 interface chamber
40 drive motor

The invention claimed is:

1. A device for energy storage, energy distribution and/or energy conversion in a hybrid or electric vehicle, comprising at least one high-voltage system having at least one high-voltage assembly, wherein the high-voltage system has a hermetically encapsulated housing having at least one wall, in which housing at least one assembly chamber for accommodating the high-voltage assemblies and at least one interface chamber for accommodating at least one interface region are arranged,
   wherein the wall of the housing has at least one opening closable with the aid of a flap, and wherein an apparatus for monitoring the opening and closing operations of the flap is assigned to the at least one closable opening.

2. The device as claimed in claim 1, wherein the high-voltage assemblies have at least one battery and/or at least one device for charging the battery and/or at least one DC-DC converter and/or at least one further high-voltage component.

3. The device as claimed in claim 2, wherein a first interface region is in the form of a high-voltage interface region.

4. The device as claimed in claim 2, wherein a second interface region is in the form of a low-voltage interface region.

5. The device as claimed in claim 2, wherein a third interface region is in the form of a communications interface region.

6. The device as claimed in claim 2, wherein the wall of the housing has at least one opening closable with the aid of a flap.

7. The device as claimed in claim 2, wherein the wall of the housing at least partially has thermally insulating properties.

8. The device as claimed in claim 1, wherein a first interface region is in the form of a high-voltage interface region.

9. The device as claimed in claim 8, wherein a third interface region is in the form of a communications interface region.

10. The device as claimed in claim 8, wherein the wall of the housing has at least one opening closable with the aid of a flap.

11. The device as claimed in claim 8, wherein a second interface region is in the form of a low-voltage interface region.

12. The device as claimed in claim 1, wherein a second interface region is in the form of a low-voltage interface region.

13. The device as claimed in claim 12, wherein a third interface region is in the form of a communications interface region.

14. The device as claimed in claim 12, wherein the wall of the housing has at least one opening closable with the aid of a flap.

15. The device as claimed in claim 1, wherein a third interface region is in the form of a communications interface region.

16. The device as claimed in claim 15, wherein the wall of the housing has at least one opening closable with the aid of a flap.

17. The device as claimed in claim 1, wherein the wall of the housing at least partially has thermally insulating properties.

18. The device as claimed in claim 1, wherein the wall of the housing at least partially has heat-dissipating regions.

19. The device as claimed in claim 18, wherein the heat-dissipating regions are formed by cooling ribs.

* * * * *